US012519045B2

(12) United States Patent
Ikeda et al.

(10) Patent No.: US 12,519,045 B2
(45) Date of Patent: Jan. 6, 2026

(54) SEMICONDUCTOR DEVICE WITH FIRST AND SECOND CONDUCTORS AND PLATED LAYER AND METHOD FOR MANUFACTURING SEMICONDUCTOR DEVICE

(71) Applicant: Hitachi Astemo, Ltd., Hitachinaka (JP)

(72) Inventors: Osamu Ikeda, Tokyo (JP); Yusuke Takagi, Hitachinaka (JP); Yujiro Kaneko, Hitachinaka (JP); Shota Funato, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 508 days.

(21) Appl. No.: 17/928,724

(22) PCT Filed: Feb. 26, 2021

(86) PCT No.: PCT/JP2021/007461
§ 371 (c)(1),
(2) Date: Nov. 30, 2022

(87) PCT Pub. No.: WO2021/250947
PCT Pub. Date: Dec. 16, 2021

(65) Prior Publication Data
US 2023/0298983 A1 Sep. 21, 2023

(30) Foreign Application Priority Data

Jun. 8, 2020 (JP) ................. 2020-099711

(51) Int. Cl.
H01L 23/495 (2006.01)
H01L 21/48 (2006.01)
H01L 23/00 (2006.01)

(52) U.S. Cl.
CPC .... *H01L 23/49582* (2013.01); *H01L 21/4821* (2013.01); *H01L 24/29* (2013.01);
(Continued)

(58) Field of Classification Search
CPC ........... H01L 23/49582; H01L 21/4821; H01L 23/49513
(Continued)

(56) References Cited

U.S. PATENT DOCUMENTS

2015/0319876 A1* 11/2015 Ohashi ................... H05K 7/02
361/728
2016/0126204 A1 5/2016 Kadoguchi et al.
(Continued)

FOREIGN PATENT DOCUMENTS

JP 2014-123745 A 7/2014
JP 2016-92063 A 5/2016
(Continued)

OTHER PUBLICATIONS

International Search Report with English Translation and Written Opinion dated Jun. 1, 2021 in corresponding International Application No. PCT/JP2021/007461.

*Primary Examiner* — Quoc D Hoang
(74) *Attorney, Agent, or Firm* — Foley & Lardner LLP

(57) ABSTRACT

A semiconductor device includes: a semiconductor element; and a first conductor and a second conductor respectively joined to a first surface and a second surface of the semiconductor element via Sn-based solder, in which a Ni-based plated layer is formed on surfaces of the first conductor and the second conductor that oppose the Sn-based solder and on the first surface and the second surface of the semiconductor element, and an interface reaction inhibition layer made of
(Continued)

(Cu, Ni)$_6$Sn$_5$ and having a layer thickness of 1.2 to 4.0 μm is formed at an interface between the Ni-based plated layer and the Sn-based solder.

8 Claims, 10 Drawing Sheets

(52) U.S. Cl.
CPC .............. *H01L 24/32* (2013.01); *H01L 24/33* (2013.01); *H01L 24/83* (2013.01); *H01L 2224/29111* (2013.01); *H01L 2224/29139* (2013.01); *H01L 2224/29147* (2013.01); *H01L 2224/32245* (2013.01); *H01L 2224/33181* (2013.01); *H01L 2224/83447* (2013.01); *H01L 2224/83455* (2013.01); *H01L 2224/83801* (2013.01)

(58) Field of Classification Search
USPC ......................................................... 257/677
See application file for complete search history.

(56) References Cited

U.S. PATENT DOCUMENTS

2016/0126207 A1    5/2016  Kadoguchi
2017/0141068 A1*  5/2017  Kadoguchi ............. H01L 24/32

FOREIGN PATENT DOCUMENTS

| | | |
|---|---|---|
| JP | 2016-92064 A | 5/2016 |
| JP | 2017-92399 A | 5/2017 |
| NL | 2022578 A | 8/2019 |
| WO | WO-2019/163145 A1 | 8/2019 |

* cited by examiner

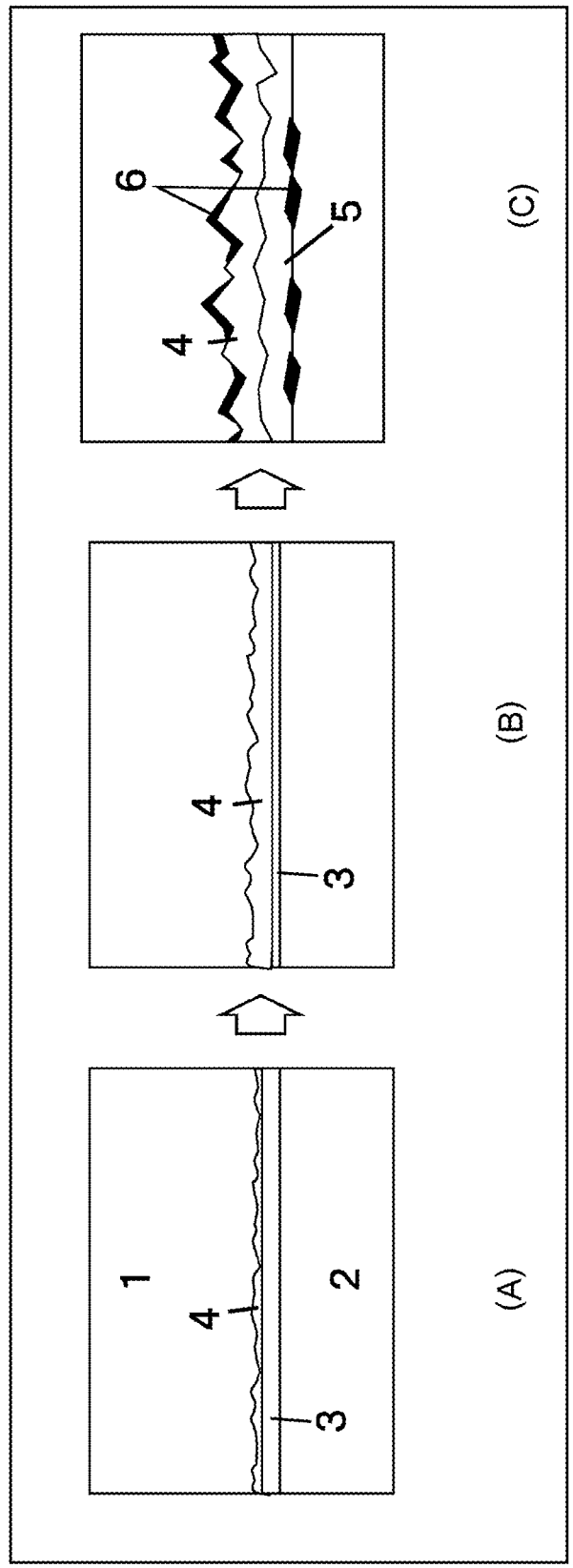

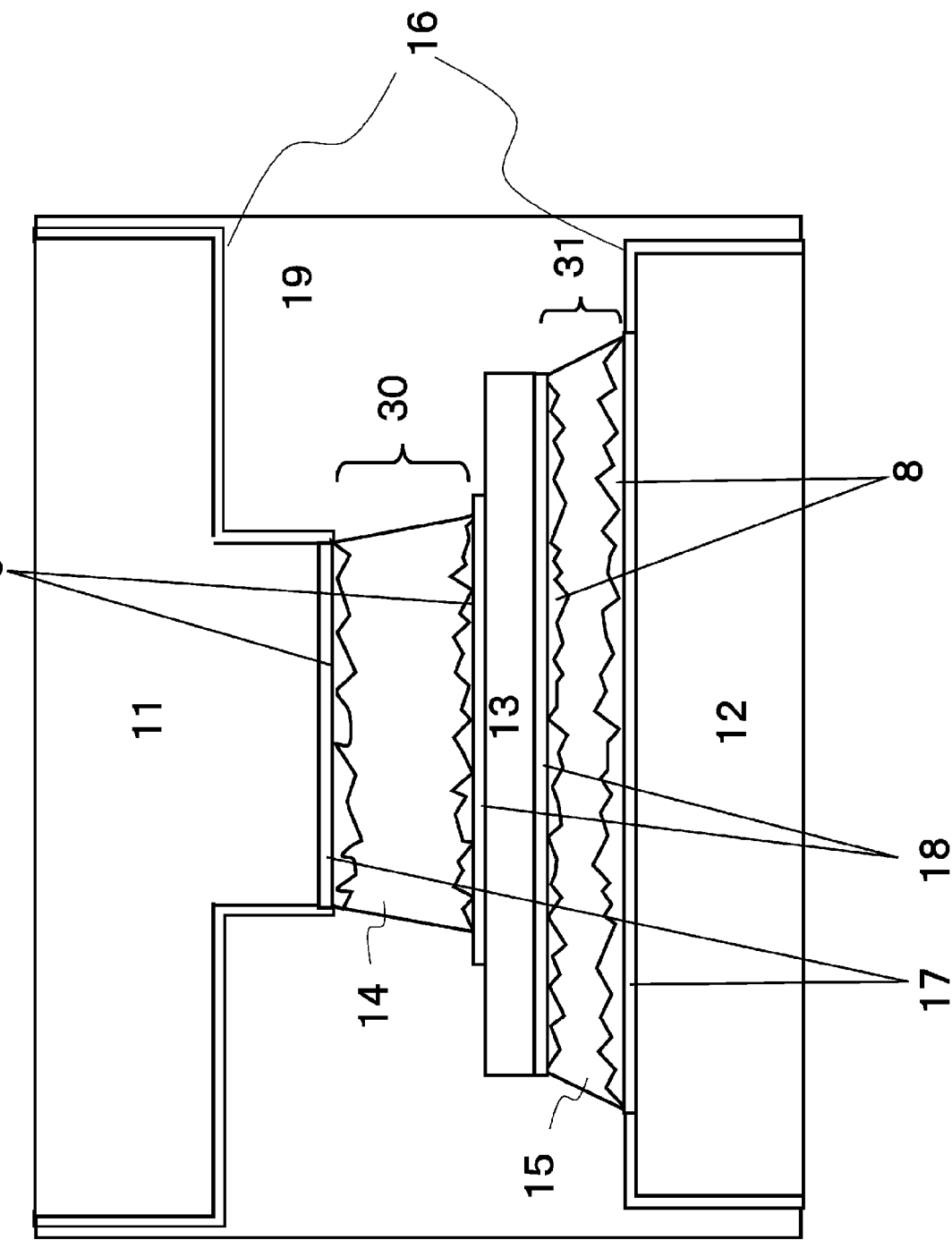

FIG. 3

| TEST EXAMPLE | EMITTER SIDE ||| COLLECTOR SIDE ||| JOINT RELIABILITY ||
| --- | --- | --- | --- | --- | --- | --- | --- | --- |
| | COMPOSITION OF SOLDER (mass%) 301 | THICKNESS OF SOLDER JOINT (μm) 302 | THICKNESS OF INTERFACE REACTION INHIBITION LAYER (μm) 303 | COMPOSITION OF SOLDER (mass%) 311 | THICKNESS OF SOLDER JOINT (μm) 312 | THICKNESS OF INTERFACE REACTION INHIBITION LAYER (μm) 313 | HIGH-TEMPERATURE HOLD TEST (1000h) 321 | POWER CYCLE TEST (50000 CYCLES) 322 |
| 1 | Sn-2Cu | 120 TO 200 | 1.2 | Sn-3Ag-2Cu | 70 TO 100 | 1.2 | ○ | ○ |
| 2 | Sn-2Cu | 120 TO 200 | 1.5 | Sn-3Ag-2Cu | 70 TO 100 | 1.4 | ○ | ○ |
| 3 | Sn-2Cu | 120 TO 200 | 1.8 | Sn-3Ag-2Cu | 70 TO 100 | 1.5 | ○ | ○ |
| 4 | Sn-2Cu | 120 TO 200 | 2.0 | Sn-3Ag-5Cu | 70 TO 100 | 2.2 | ○ | ○ |
| 5 | Sn-5Cu | 120 TO 200 | 2.3 | Sn-3Ag-5Cu | 70 TO 100 | 2.2 | | ○ |
| 6 | Sn-4Cu | 120 TO 200 | 1.7 | Sn-3Ag-5Cu | 70 TO 100 | 2.2 | | ○ |

FIG. 9

| TEST EXAMPLE | EMITTER SIDE ||| COLLECTOR SIDE ||| JOINT RELIABILITY ||
| --- | --- | --- | --- | --- | --- | --- | --- | --- |
| | COMPOSITION OF SOLDER (mass%) | THICKNESS OF SOLDER JOINT (μm) | THICKNESS OF INTERFACE REACTION INHIBITION LAYER (μm) | COMPOSITION OF SOLDER (mass%) | THICKNESS OF SOLDER JOINT (μm) | THICKNESS OF INTERFACE REACTION INHIBITION LAYER (μm) | HIGH-TEMPERATURE HOLD TEST (1000h) | POWER CYCLE TEST (50000 CYCLES) |
| 7 | Sn-2Cu | 120 TO 200 | 1.8 | Sn-3A-2Cu + Cu MEMBER | 70 TO 100 | 2.5 | ○ | ○ |
| 8 | Sn-2Cu + Cu MEMBER | 120 TO 200 | 2.8 | Sn-3A-2Cu + Cu MEMBER | 70 TO 100 | 2.5 | ○ | ○ |

| COMPARATIVE EXAMPLE | EMITTER SIDE | | | COLLECTOR SIDE | | | JOINT RELIABILITY | |
|---|---|---|---|---|---|---|---|---|
| | COMPOSITION OF SOLDER (mass%) 301 | THICKNESS OF SOLDER JOINT (μm) 302 | THICKNESS OF INTERFACE REACTION INHIBITION LAYER (μm) 303 | COMPOSITION OF SOLDER (mass%) 311 | THICKNESS OF SOLDER JOINT (μm) 312 | THICKNESS OF INTERFACE REACTION INHIBITION LAYER (μm) 313 | HIGH-TEMPERATURE HOLD TEST (1000h) 321 | POWER CYCLE TEST (50000 CYCLES) 322 |
| 1 | Sn–3Ag–0.5Cu | 120 TO 200 | 1.0 | Sn–3Ag–0.5Cu | 70 TO 100 | 0.8 | × | × |
| 2 | Sn–0.75Cu | 120 TO 200 | 1.1 | Sn–0.75Cu | 70 TO 100 | 0.8 | × | × |
| 3 | Sn–1Cu | 120 TO 200 | 1.2 | Sn–3Ag–2Cu | 70 TO 100 | 1.0 | × | ○ |
| 4 | Sn–7Cu | 120 TO 200 | 5.5 | Sn–7Cu | 70 TO 100 | 4.5 | ○ | × |
| 5 | Sn–3Ag–2Cu | 120 TO 200 | 1.5 | Sn–3Ag–2Cu | 70 TO 100 | 1.4 | ○ | × |

SEMICONDUCTOR DEVICE WITH FIRST AND SECOND CONDUCTORS AND PLATED LAYER AND METHOD FOR MANUFACTURING SEMICONDUCTOR DEVICE

TECHNICAL FIELD

The present invention relates to a semiconductor device and a method for manufacturing the semiconductor device.

BACKGROUND ART

A semiconductor device is used for an inverter that mutually converts alternating-current power and direct-current power. Use of lead is regulated by the RoHS instruction and the ELV instruction in in-vehicle inverters, for example, lead-free solder mainly composed of Sn-3Ag-0.5Cu (mass %) has been used so far.

In a semiconductor device used in an inverter, high power density for miniaturization and weight reduction is current, and there is a demand for enhancing heat dissipation from both surfaces of a semiconductor element by solder-joining both surfaces of the semiconductor element and a conductor, for raising a guaranteed temperature of a joint between the semiconductor element and the conductor to flow a large amount of current, and the like.

On the other hand, an in-vehicle semiconductor element has an area exceeding 10 mm×10 mm and has a small thickness of about 100 µm. Therefore, when both surfaces are soldered, stress cannot be relaxed as compared with a case where only one surface of the semiconductor element is solder-joined. Therefore, the semiconductor element is easily cracked. If the joint of the semiconductor element is at a temperature of up to 150° C., reliability can be secured even with the Sn-3Ag-0.5Cu solder, but if the temperature rises to 175° C., an interface reaction between the solder and the conductor becomes fast, and therefore deterioration is likely to occur at the joint interface.

FIGS. 1(A) to 1(C) are schematic views of deterioration of Sn-based solder under high temperature. As illustrated in FIG. 1(A), as an example, Sn-based solder 1 is disposed on a conductor (Cu) 2 subjected to Ni plating 3. When an interface reaction between the Sn-based solder 1 and the Ni plating 3 proceeds under high temperature, the layer of the Ni plating 3 becomes thin as illustrated in FIG. 1(B), and a brittle intermetallic compound such as a Ni—Sn-based compound 4 is formed at the joint interface. Furthermore, as illustrated in FIG. 1(C), the layer of the Ni plating 3 disappears, a brittle intermetallic compound such as the Ni—Sn-based compound 4 or a Cu—Sn-based compound 5 grows thicker at the joint interface, a void 6 is generated, and a volume change occurs. This causes deterioration of the joint interface that leads to a decrease in joint strength, an increase in thermal resistance, and the like.

Patent Literature 1 describes a semiconductor device having heat resistance of 200° C. or more is realized by suppressing interface reactions by combining Ni-based plating with Sn-based solder blended with a $Cu_6Sn_5$ phase at room temperature to 200° C. as a connection method with the heat resistance of 200° C.

CITATION LIST

Patent Literature

PTL 1: JP 2014-123745 A

SUMMARY OF INVENTION

Technical Problem

In the device described in Patent Literature 1, in a case of a structure where the joining area of the semiconductor element is increased and both surfaces of the semiconductor element are joined, the stress generated in the semiconductor element increases, a thick intermetallic compound is formed at the joint interface between the semiconductor element and the solder, and the semiconductor element becomes likely to crack.

Solution to Problem

A semiconductor device according to a first aspect of the present invention includes: a semiconductor element; and a first conductor and a second conductor respectively joined to a first surface and a second surface of the semiconductor element via Sn-based solder, in which a Ni-based plated layer is preferably formed on surfaces of the first conductor and the second conductor that oppose the Sn-based solder and on the first surface and the second surface of the semiconductor element, and an interface reaction inhibition layer made of $(Cu, Ni)_6Sn_5$ and having a layer thickness of 1.2 to 4.0 µm is preferably formed at an interface between the Ni-based plated layer and the Sn-based solder.

A method for manufacturing a semiconductor device according to a second aspect of the present invention preferably includes: forming a Ni plated layer on a collector-side lead frame; supplying, onto the Ni plated layer, Sn—Ag—Cu-based solder blended with a Cu member and having a Cu content of equal to or greater than 1.5 mass %, and joining a semiconductor element; and supplying, onto the semiconductor element, Sn—Cu-based solder having a Cu content of equal to or greater than 1.5 mass %, and joining an emitter-side lead frame on which Cu plating is applied onto a Ni plated layer.

A method for manufacturing a semiconductor device according to a third aspect of the present invention preferably includes: forming a Ni plated layer on a collector-side lead frame; forming Cu plating on the Ni plated layer; supplying Sn—Ag—Cu-based solder having a Cu content of equal to or greater than 1.5 mass % onto the Cu plating, and joining a semiconductor element; and supplying, onto the semiconductor element, Sn—Cu-based solder having a Cu content of equal to or greater than 1.5 mass %, and joining an emitter-side lead frame on which Cu plating is applied onto a Ni plated layer.

Advantageous Effects of Invention

According to the present invention, it is possible to suppress deterioration of a joint interface with solder and to prevent cracking of a semiconductor element.

BRIEF DESCRIPTION OF DRAWINGS

FIGS. 1(A) to (C) are schematic views of deterioration of Sn-based solder under high temperature.

FIG. 2 is a cross-sectional view of a semiconductor device according to a first embodiment.

FIG. 3 is a table showing setting values of the semiconductor device according to the first embodiment.

FIG. 9 is a table showing setting values of the semiconductor device according to the second embodiment.

FIG. 10 is a table showing a test of a semiconductor device according to a comparative example.

DESCRIPTION OF EMBODIMENTS

Figure 4:
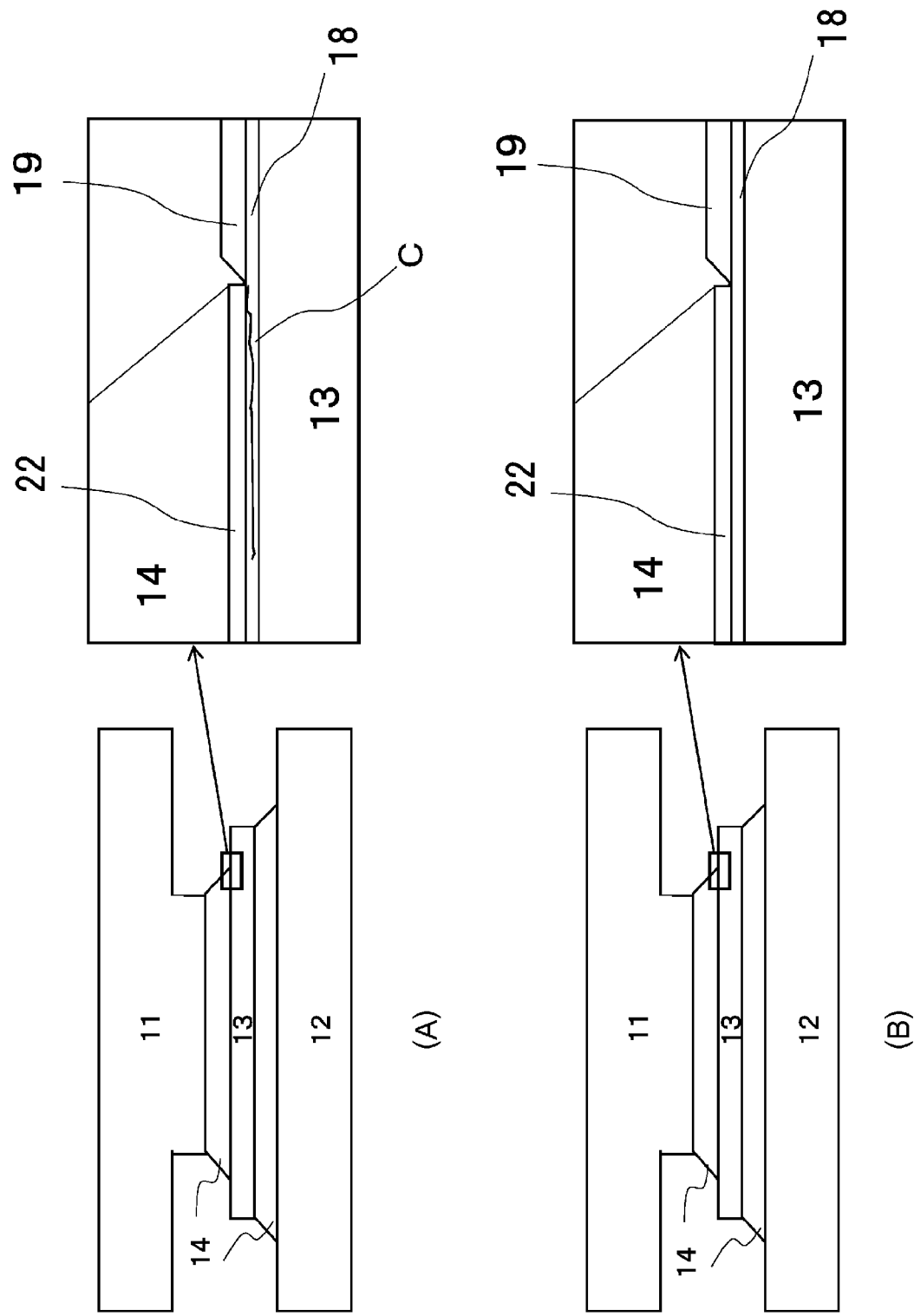
FIGS. 4(A) and (B) are schematic views of a crack generated in an Al electrode of a semiconductor element.

Embodiments of the present invention will be described below with reference to the drawings. The following description and drawings are illustrative of the present invention and are omitted and simplified as appropriate for a clearer description. The present invention can also be carried out in various other forms. Unless otherwise specified, each component may be singular or plural.

For the purpose of facilitating understanding of the invention, the position, size, shape, range, and the like, of each component illustrated in the drawings do not necessarily represent the actual position, size, shape, range, and the like. Therefore, the present invention is not necessarily limited to the position, size, shape, range, and the like, disclosed in the drawings.

First Embodiment

FIG. 2 is a cross-sectional view of the semiconductor device according to the present embodiment.

As illustrated in FIG. 2, a Ni plated layer 17 is formed on a lead frame 12, which is a collector-side conductor. In the Ni plated layer 17, a solder mounting surface of the Cu lead frame 12 having a roughened Ni plated layer 16 is subjected to laser treatment to obtain a smooth Ni plated surface. To the solder mounting surface of the Ni plated layer 17, one surface of a semiconductor element 13 having an electrode including Ni—P plating 18 is joined by supplying Sn—Ag—Cu-based solder 15. Sn—Cu-based solder 14 is supplied to the other surface of the semiconductor element 13 having the electrode including the Ni—P plating 18 to join a lead frame 11, which is an emitter-side conductor provided with the Ni plated layer 17.

The emitter-side lead frame 11 is subjected to an oxidation treatment in advance, and only a solder joint surface is subjected to laser treatment to remove an oxide film, and the solder mounting surface of the Ni plated layer 17 is processed smoothly. This makes it possible to prevent wetting up of the Sn—Cu-based solder 14. After joining up to the emitter-side lead frame 11, wire bonding is applied to the gate electrode of the semiconductor element 13, and sealing is performed with a mold resin 19. Hereinafter, although not illustrated, after sealing is performed with the mold resin 19, a pin fin for cooling is joined to each of the exposed lead frame 11 and the lead frame 12 via an insulating resin. That is, the present embodiment is a double-sided cooling type semiconductor device.

In the semiconductor device illustrated in FIG. 2, the Ni plated layer 17 on the solder mounting surface to be solder-joined is formed by smooth Ni plating that easily secures solder wetting as described above, and the Ni-based plated layer at the portion where the lead frames 11 and 12 are in contact with the mold resin 19 is formed by the roughened Ni plated layer 16, whereby adhesion strength between the lead frames 11 and 12 and the mold resin 19 can be improved, and reliability can be secured. By forcibly oxidizing the Ni plated layer 17 of the emitter-side lead frame 11, it is possible to prevent a Sn-based solder 14 from wetting up on the lead frame 11 at the time of solder joining on the emitter side, and it becomes easy to control the solder thickness to a desired solder thickness. If wetting up can be prevented, the contact area between the roughened Ni-based plated layer 16 of the lead frame 11 and the mold resin 19 increases, and therefore higher reliability can be obtained.

When the semiconductor device manufactured as described above is incorporated as an inverter and energized, the temperature becomes high. Under high temperature, in the semiconductor device, as illustrated in FIG. 2, an interface reaction inhibition layer 8 made of $(Cu, Ni)_6Sn_5$ and having a layer thickness of 1.2 to 4.0 μm is formed at an interface between the Ni-based plated layer 17 and the Sn—Cu-based solder 14 and the Sn—Ag—Cu-based solder 15 (the Sn—Cu-based solder 14 and the Sn—Ag—Cu-based solder 15 are collectively referred to as Sn-based solder). The layer thickness of the interface reaction inhibition layer 8 is more preferably 1.4 to 3.2 μm.

An emitter-side solder joint 30 is formed of the Sn—Cu-based solder 14 and the interface reaction inhibition layer 8. A collector-side solder joint 31 is formed of the Sn—Ag—Cu-based solder 15 and the interface reaction inhibition layer 8.

FIG. 3 is a table showing a test example of the semiconductor device according to the present embodiment.

As illustrated in FIG. 3, setting values of a composition 301 of the Sn—Cu-based solder 14, a thickness 302 of the solder joint 30, and a thickness 303 of the interface reaction inhibition layer 8 in the emitter-side solder joint 30 are described for each of Test Examples 1 to 6. Furthermore, setting values of a composition 311 of the Sn—Ag—Cu-based solder 15, a thickness 312 of the solder joint 31, and a thickness 313 of the interface reaction inhibition layer 8 in the collector-side solder joint 31 are described for each of Test Examples 1 to 6. Furthermore, the results of a high-temperature hold test 321 at 175° C. and a power cycle test 322 in joint reliability are described for each of Test Examples 1 to 6.

For example, in Test Example 1, the composition 301 of the Sn—Cu-based solder 14 is Sn-2Cu, the thickness 302 of the solder joint 30 is 120 to 200 μm, the thickness 303 of the interface reaction inhibition layer 8 is 1.2 μm, the composition 311 of the Sn—Ag—Cu-based solder 15 is Sn-3Ag-2Cu, the thickness 312 of the solder joint 31 is 70 to 100 μm, and the thickness 313 of the interface reaction inhibition layer 8 is 1.2 μm, the high-temperature hold test 321 at 175° C. is good (○), and the power cycle test 322 is good (○).

The high-temperature hold test 321 at 175° C. is a test of holding under high temperature of 175° C. for 1000 hours. The power cycle test 322 is a test of 50000 cycles under a condition of 175° C. to 75° C. As a result, a case where desired electrical characteristics were maintained in a voltage change between the emitter and the collector also after the test was judged as ○, and a case where the electrical characteristics were deteriorated was judged as x. In the evaluation, three semiconductor devices were evaluated for each of Test Examples 1 to 6. As a result, as illustrated in FIG. 3, the electrical characteristics of the semiconductor element 13 were not deteriorated in any of Test Examples 1 to 6.

As illustrated in Test Examples 1 to 6 of FIG. 3, in the semiconductor device, the thickness 302 of the emitter-side solder joint 30 is 120 to 200 μm, and the thickness 312 of the collector-side solder joint 31 is 70 to 100 μm. That is, the emitter-side solder joint 30 is thicker than the collector-side solder joint 31. This makes it possible to suppress cracking of the semiconductor element 13 caused by a difference between heat generation and cooling generated when the semiconductor element 13 is repeatedly turned on/off, and a crack and a creep void generated in the solder layer.

As illustrated in Test Examples 1 to 6 of FIG. 3, the emitter-side Sn—Cu-based solder 14 has a Cu content of equal to or greater than 2 mass % and does not contain Ag. The collector-side Sn—Ag—Cu-based solder 15 has a Cu content of equal to or greater than 2 mass % and contains 2 to 4 mass % of Ag. When the Cu content of the collector-side Sn—Ag—Cu-based solder 15 is equal to or greater than 2 mass % and Ag is contained in an amount of 2 to 4 mass %, the strength of the Sn—Ag—Cu-based solder 15 can be improved, and crack development to the Sn—Ag—Cu-based solder 15 can be suppressed. When the Cu content of the Sn—Ag—Cu-based solder 15 is equal to or greater than 5 mass %, the stability of the joint interface can be obtained even under high temperature.

FIGS. 4(A) and 4(B) are schematic views of a crack generated in an Al electrode 22 of the semiconductor element 13. FIG. 4(A) illustrates a crack generated in the Al electrode 22 of the semiconductor element 13 when reliability is not obtained, together with its enlarged view. FIG. 4(B) illustrates that no crack is generated in the Al electrode 22 of the semiconductor element 13 when the reliability is obtained, together with its enlarged view.

As illustrated in FIG. 4(A), in the structure of the semiconductor element 13 in which the lead frames 11 and 12 are joined to both surfaces of the semiconductor element 13 by the Sn-based solder 14, there is a case where a crack C occurs in the Al electrode 22 of the semiconductor element 13. As described above, in Test Examples 1 to 6 of FIG. 3, the composition 301 of the emitter-side Sn—Cu-based solder 14 has a Cu content of equal to or greater than 2 mass %, and does not contain Ag. As illustrated in FIG. 4(B) this makes it possible to suppress the occurrence of a cracks in the Al electrode 22 formed on the upper surface of the semiconductor element 13.

Figure 5:
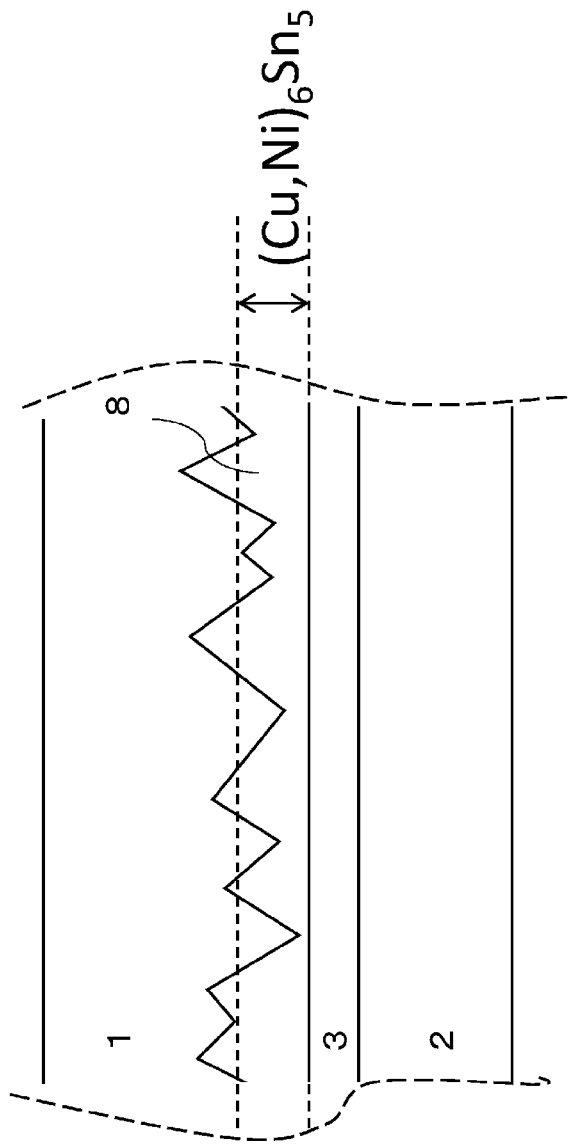
FIG. 5 is a cross-sectional view explaining the definition of the thickness of an interface reaction inhibition layer.

FIG. 5 is a cross-sectional view explaining the definition of the thickness of the interface reaction inhibition layer 8.

The Sn-based solder 1 is disposed on the conductor (Cu) 2 subjected to the Ni plating 3. The interface reaction between the Sn-based solder 1 and the Ni plating 3 proceeds under high temperature as described above, and the interface reaction inhibition layer 8 made of $(Cu, Ni)_6Sn_5$ is formed. Here, the interface reaction inhibition layer 8 has irregularities, and therefore the thickness of the interface reaction inhibition layer 8 is defined as a mean thickness when irregularities of $(Cu, Ni)_6Sn_5$ formed on the Ni plating 3 as illustrated in FIG. 5 are smoothed out. The thicknesses 303 and 313 of the interface reaction inhibition layer 8 illustrated in FIG. 3 are based on this definition.

Figure 6:
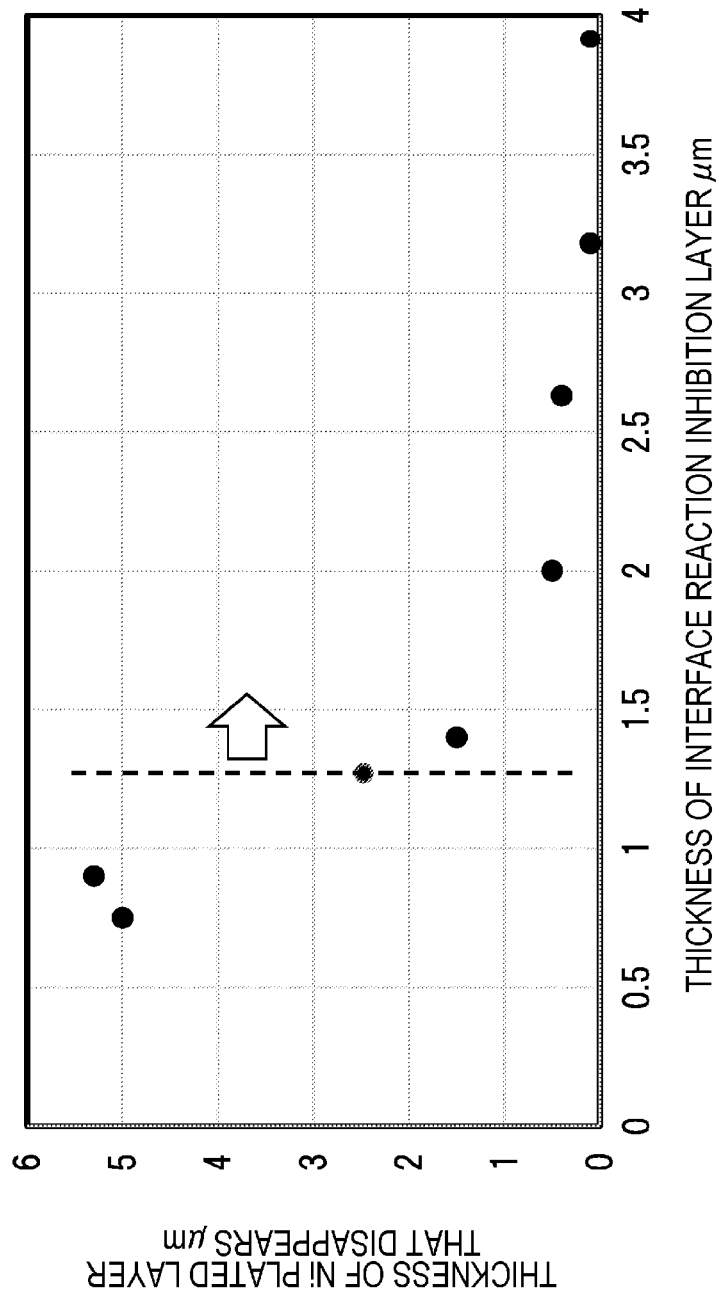
FIG. 6 is a graph showing a relationship between the thickness of the interface reaction inhibition layer and the thickness of a Ni plated layer that disappears.

FIG. 6 is a graph showing the relationship between the thickness of the interface reaction inhibition layer 8 and the thickness of the Ni plated layer 17 that disappears. In FIG. 6, the horizontal axis represents the thickness of the interface reaction inhibition layer 8 made of $(Cu, Ni)_6Sn_5$, and the vertical axis represents the thickness of the Ni plated layer 17 that disappears after holding 175° C. for 1000 hours.

By applying Ni-based plating to the semiconductor element 13 and the lead frames (conductors) 11 and 12 to be joined, it is possible to delay the interface reaction even if the lead frame is held at a high temperature of 175° C. as compared with a pure Cu lead frame. Then, as illustrated in FIG. 6, when the thickness of the interface reaction inhibition layer 8 is equal to or less than about 1.2 μm, the Ni plated layer 17 that disappears after holding 175° C. for 1000 hours becomes large, and the possibility that the Ni plated layer 17 disappears becomes high. On the other hand, by forming the interface reaction inhibition layer 8 made of $(Cu, Ni)_6Sn_5$ and having a layer thickness of 1.2 to 4.0 μm, more preferably 1.4 to 3.2 μm, on the Ni plated layer 17, as illustrated in FIG. 6, it is possible to make the Ni plated layer 17 that disappears small, and effectively inhibit the interface reaction under high temperature of 175° C.

Figure 7:
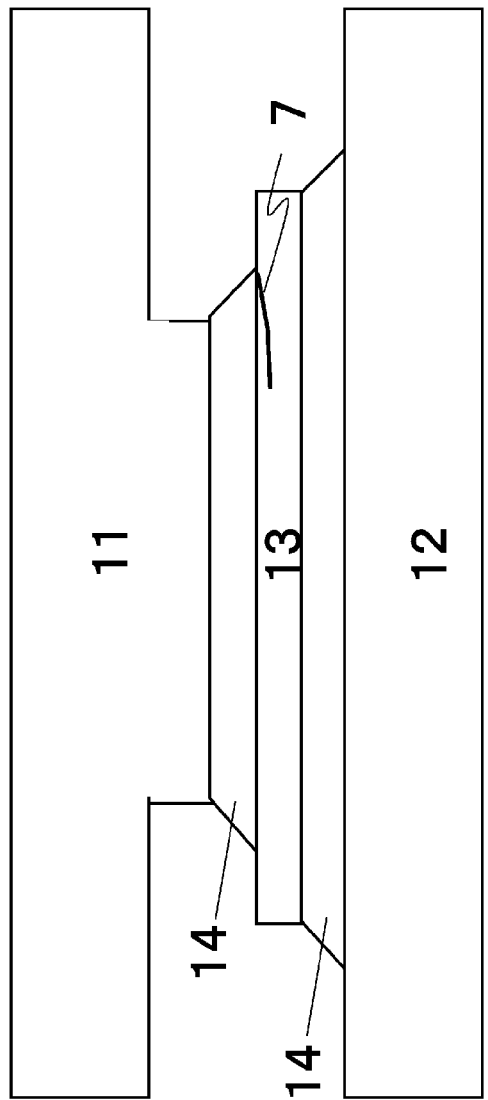
FIG. 7 is a schematic view of cracking of the semiconductor element in a cross section of the semiconductor device.

FIG. 7 is a schematic view of cracking of the semiconductor element 13 in a cross section of the semiconductor device.

When the interface reaction inhibition layer 8 is made equal to or more than about 4.0 μm, the interface reaction can be more effectively inhibited, but as illustrated in FIG. 7, in the structure of the semiconductor element 13 in which the lead frames 11 and 12 are joined to both surfaces of the semiconductor element 13 by the Sn-based solder 14, there is a possibility that cracking 7 of the semiconductor element 13 occurs. Therefore, by making the thickness of the interface reaction inhibition layer 8 to 1.2 to 4.0 μm, more preferably 1.4 to 3.2 μm, it is possible to prevent the cracking 7 of the semiconductor element 13 and inhibit the interface reaction.

Second Embodiment

Figure 8:
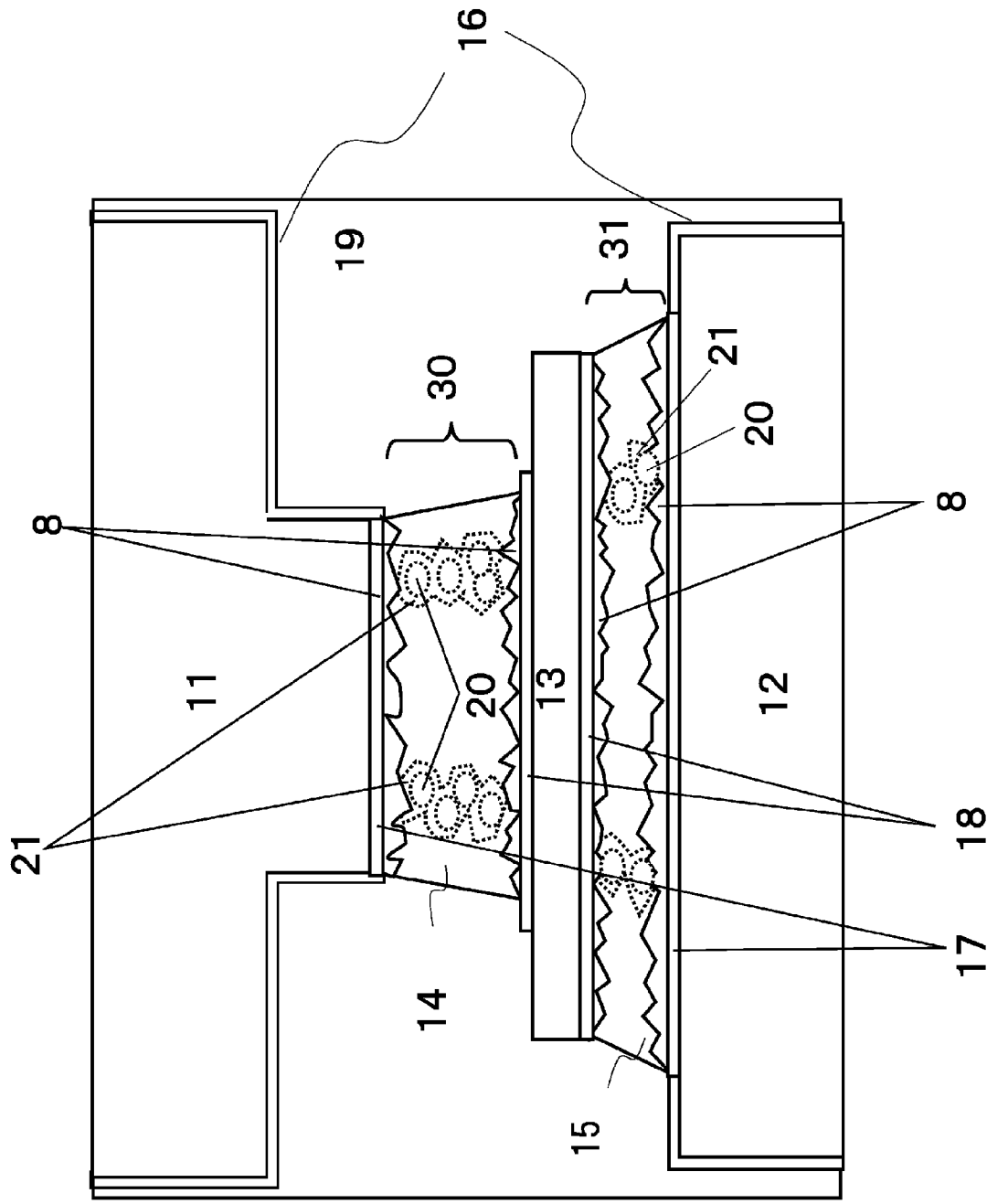
FIG. 8 is a cross-sectional view of a semiconductor device according to a second embodiment.

FIG. 8 is a cross-sectional view of the semiconductor device according to the second embodiment. The same portions as those of the first embodiment illustrated in FIG. 2 are denoted by the same reference numerals, and the description thereof will be omitted.

In the present embodiment, at least one of the Sn—Cu-based solder 14 and the Sn—Ag—Cu-based solder 15 is blended with a Cu member 20. The Cu member 20 is, for example, Cu powder paste, a mixed paste of Cu powder and solder powder, or a Cu wire. This makes it possible to diffuse Cu into the Sn—Cu-based solder 14 or the Sn—Ag—Cu-based solder 15 at the time of joining, and easily form the interface reaction inhibition layer 8 made of $(Cu, Ni)_6Sn_5$ with a desired thickness in the emitter-side solder joint 30 or the collector-side solder joint 31.

As illustrated in FIG. 8, the solder mounting surface of the lead frame 12, which is a Cu conductor having the roughened Ni plated layer 16, is subjected to laser treatment to form the smooth Ni plated layer 17. A desired amount of a paste material made of Cu powder, which is the Cu member 20 and has a diameter of 15 μm, Sn powder, and a solvent is supplied onto the Ni plated layer 17. Thereafter, the collector-side Sn-based solder 15 is supplied to the solder mounting position. The semiconductor element 13 having an electrode including the Ni—P plating 18 is mounted thereon and joined. Due to this, Cu is diffused from the Cu powder into the solder, and formation of the interface reaction inhibition layer 8 made of $(Cu, Ni)_6Sn_5$ formed at the joint interface is facilitated. A $(Cu, Ni)_6Sn_5$ compound 21 is formed around the Cu member 20. Furthermore, the Sn-based solder 14 is supplied onto the electrode including the Ni—P plating 18 on the upper surface of the joined semiconductor element 13. Alternatively, before the solder is supplied, a desired amount of a paste material made of Cu powder, which is the Cu member 20 and has a diameter of 15 µm, Sn powder, and a solvent is supplied. The Cu lead frame 11 having the roughened Ni plated layer 16 is joined thereto.

The emitter-side lead frame 11 is subjected to the oxidation treatment in advance, and only the solder joint surface is subjected to laser treatment to remove the oxide film, and at the same time, the surface of the Ni plated layer 17 is processed smoothly. This makes it possible to prevent wetting up of the solder. After mounting up to the emitter-side lead frame 11, wire bonding is applied to the gate electrode of the semiconductor element 13, and then sealing is performed with the mold resin 19. Hereinafter, although not illustrated, after sealing is performed with the mold resin 19, a pin fin for cooling is joined to each of the exposed lead frame 11 and the lead frame 12 via an insulating resin. That is, the present embodiment is a double-sided cooling type semiconductor device.

In the example of FIG. 8, the Ni plated layer 17 is formed on the collector-side lead frame 12, and the Sn—Ag—Cu-based solder 15 blended with the Cu member 20 and having a Cu content of equal to or greater than 1.5 mass % is supplied onto the Ni plated layer 17 to join the semiconductor element 13. Then, the Sn—Cu-based solder 14 having a Cu content of equal to or greater than 1.5 mass % is supplied onto the semiconductor element 13, and the emitter-side lead frame 11 on which Cu plating is applied is joined onto the Ni plated layer 17. While the example of using the Sn—Ag—Cu-based solder 15 blended with the Cu member 20 and having a Cu content of equal to or greater than 1.5 mass % has been described, the Cu member 20 needs not be contained. In this case, Cu plating is formed on the Ni plated layer 17 instead of the Cu member 20.

When the semiconductor device manufactured as described above is incorporated as an inverter and energized, the temperature becomes high. Under high temperature, in the semiconductor device, as illustrated in FIG. 8, the interface reaction inhibition layer 8 made of $(Cu, Ni)_6Sn_5$ and having a layer thickness of 1.2 to 4.0 µm is formed at an interface between the Ni-based plated layer 17 and the Sn—Cu-based solder 14 and the Sn—Ag—Cu-based solder 15 (the Sn—Cu-based solder 14 and the Sn—Ag—Cu-based solder 15 are collectively referred to as Sn-based solder). The layer thickness of the interface reaction inhibition layer 8 is more preferably 1.4 to 3.2 µm.

FIG. 9 is a table showing a test example of the semiconductor device according to the present embodiment.

As illustrated in FIG. 9, setting values of the composition 301 of the Sn—Cu-based solder 14, the thickness 302 of the solder joint 30, and the thickness 303 of the interface reaction inhibition layer 8 in the emitter-side solder joint 30, and the composition 311 of the Sn—Ag—Cu-based solder 15, the thickness 312 of the solder joint 31, and the thickness 313 of the interface reaction inhibition layer 8 in the collector-side solder joint 31 are described for each of Test Examples 7 and 8, similarly to FIG. 3. Furthermore, the results of a high-temperature hold test 321 at 175° C. and a power cycle test 322 in joint reliability are described for each of Test Examples 7 and 8.

For example, in Test Example 7, the composition 301 of the Sn—Cu-based solder 14 is Sn-2Cu, the thickness 302 of the solder joint 30 is 120 to 200 µm, the thickness 303 of the interface reaction inhibition layer 8 is 1.8 µm, the composition 311 of the Sn—Ag—Cu-based solder 15 is a Sn-3Ag-2Cu+Cu member, the thickness 312 of the solder joint 31 is 70 to 100 µm, and the thickness 313 of the interface reaction inhibition layer 8 is 2.5 µm, the high-temperature hold test 321 at 175° C. is good (○), and the power cycle test 322 is good (○).

In Test Example 8, the composition 301 of the Sn—Cu-based solder 14 is a Sn-2Cu+Cu member, the thickness 302 of the solder joint 30 is 120 to 200 µm, the thickness 303 of the interface reaction inhibition layer 8 is 2.8 µm, the composition 311 of the Sn—Ag—Cu-based solder 15 is a Sn-3Ag-2Cu+Cu member, the thickness 312 of the solder joint 31 is 70 to 100 µm, the thickness 313 of the interface reaction inhibition layer 8 is 2.5 µm, the high-temperature hold test 321 at 175° C. is good (○), and the power cycle test 322 is good (○).

The high-temperature hold test 321 at 175° C. is a test of holding under high temperature of 175° C. for 1000 hours. The power cycle test 322 is a test of 50000 cycles under a condition of 175° C. to 75° C. As a result, a case where desired electrical characteristics were maintained in a voltage change between the emitter and the collector also after the test was judged as ○, and a case where the electrical characteristics were deteriorated was judged as x. In the evaluation, three semiconductor devices were evaluated for each of Test Examples 7 and 8. As a result, as illustrated in FIG. 9, the electrical characteristics of the semiconductor element 13 were not deteriorated in any of Test Examples 7 and 8.

By blending the Cu member 20 into the collector-side lead frame 12, Cu diffuses into the solder when the Sn—Ag—Cu-based solder 15 is supplied to join the semiconductor element 13, and the interface reaction inhibition layer 8 made of $(Cu, Ni)_6Sn_5$ and having a desired thickness can be easily formed on the Ni-based plated layers 17 of the semiconductor element 13 and the lead frame 12. By joining, with the Sn—Cu-based solder 14, the emitter-side lead frame 11 in which the Cu member 20 is blended on the semiconductor element 13, it is possible to easily form the interface reaction inhibition layer 8 having a desired thickness on the Ni-based plated layers 17 of the semiconductor element 13 and the lead frame 11. If the Cu member 20 is a paste containing Cu particles, Cu can be efficiently diffused into the solder, and the interface reaction inhibition layer 8 can be quickly formed.

Cu plating is performed on the Ni plated layer 17 of the collector-side lead frame 12 and the emitter-side lead frame 11 without using the Cu member 20, thereby completely reacting the Cu plating with the solder. That is, Cu diffuses into the solder from the Cu plating at the time of joining with the solder, and the interface reaction inhibition layer 8 having a desired thickness can be easily formed on the Ni plated layer 17 of the semiconductor element 13.

COMPARATIVE EXAMPLE

FIG. 10 is a table showing a test of the semiconductor device according to the comparative example. The comparative example is of a semiconductor device not according to the present embodiment.

As illustrated in FIG. 10, setting values of the composition 301 of the Sn—Cu-based solder 14, the thickness 302 of the solder joint 30, and the thickness 303 of the interface reaction inhibition layer 8 in the emitter-side solder joint 30, and the composition 311 of the Sn—Ag—Cu-based solder 15, the thickness 312 of the solder joint 31, and the thickness 313 of the interface reaction inhibition layer 8 in the collector-side solder joint 31 are described for each of Comparative Examples 1 to 5, similarly to FIG. 3. Furthermore, the results of a high-temperature hold test 321 at 175°

C. and a power cycle test 322 in joint reliability are described for each of Comparative Examples 1 to 5.

For example, in Comparative Example 1, the composition 301 of the Sn—Cu-based solder 14 is Sn-3Ag-0.5Cu, the thickness 302 of the solder joint 30 is 120 to 200 µm, the thickness 303 of the interface reaction inhibition layer 8 is 1.0 µm, the composition 311 of the Sn—Ag—Cu-based solder 15 is Sn-3Ag-0.5Cu, the thickness 312 of the solder joint 31 is 70 to 100 µm, the thickness 313 of the interface reaction inhibition layer 8 is 0.8 µm, the high-temperature hold test 321 at 175° C. is not acceptable (x), and the power cycle test 322 is not acceptable (x).

In Comparative Examples 1 and 2, the results of both the high-temperature hold test and the power cycle test became x. This is because the interface reaction inhibition layer made of $(Cu, Ni)_6Sn_5$ formed at the joint interface is not formed to have a sufficient thickness, and thus the joint interface is deteriorated.

In Comparative Example 3, the result of the power cycle test become o, but the result of the high-temperature hold test become x. This is considered to be because the interface reaction inhibition layer made of $(Cu, Ni)_6Sn_5$ formed at the joint interface was thicker, but was not formed with a sufficient thickness, as compared with Comparative Examples 1 and 2, and therefore the joint interface was deteriorated.

In Comparative Examples 4 and 5, the interface reaction inhibition layer made of $(Cu, Ni)_6Sn_5$ formed at the joint interface was sufficiently formed, the result of the high-temperature hold test became o. On the other hand, the result of the power cycle test became x in the both. In Comparative Example 4, the interface reaction inhibition layer was formed thick, stress on the semiconductor element 13 increased, and cracking of the semiconductor element 13 occurred. On the other hand, in Comparative Example 5, Ag was contained in the emitter-side Sn-based solder, and the solder was hard, and thus a crack developed in the Al electrode 22 of the semiconductor element 13.

Prior to the present embodiment, it has been considered to join, with binary solder, Sn—Cu solder having a Cu content of 3 to 7% to a member having Ni-based metallization. However, it has been found that in the case of a structure in which both upper and lower surfaces of the semiconductor element 13 having a thickness of about 100 µm and an area exceeding 10 mm×10 mm are joined, a semiconductor device not according to the present embodiment cannot achieve both deterioration suppression of the joint interface and cracking suppression of the semiconductor element 13 under high temperature.

In general, the larger the joining area of the semiconductor element 13 becomes, the larger the stress generated in the semiconductor element 13 becomes. An intermetallic compound made of $(Cu, Ni)_6Sn_5$ is formed thick at the joint interface between the semiconductor element 13 and the solder, the semiconductor element 13 is more likely to crack.

According to the present embodiment, in order to achieve both deterioration suppression of the joint interface and cracking suppression of the semiconductor element 13 under high temperature, it is possible to set the thickness of the interface reaction inhibition layer made of $(Cu, Ni)_6Sn_5$ formed at the interface of the joining portion to an appropriate thickness. As a result, in the semiconductor device in which both surfaces of the semiconductor element 13 having a thickness of about 100 µm and an area exceeding 10 mm×10 mm are joined with Sn-based solder, it is possible to suppress deterioration of the joint interface and cracking of the semiconductor element 13 even under high temperature of 175° C.

According to the embodiment described above, the following operational effects can be obtained.

(1) A semiconductor device includes the semiconductor element 13, and a first conductor (emitter-side lead frame 11) and a second conductor (collector-side lead frame 12) respectively joined to a first surface and a second surface of the semiconductor element 13 via the Sn-based solder 15 and 16, in which the Ni-based plated layer 17 is formed on surfaces of the first conductor and the second conductor that oppose the Sn-based solders 15 and 16 and on the first surface and the second surface of the semiconductor element 13, and the interface reaction inhibition layer 8 made of $(Cu, Ni)_6Sn_5$ and having a layer thickness of 1.2 to 4.0 µm is formed at an interface between the Ni-based plated layer 17 and the Sn-based solders 15 and 16. This makes it possible to suppress deterioration of a joint interface with solder and to prevent cracking of a semiconductor element.

(2) A method for manufacturing a semiconductor device, the method includes: forming the Ni plated layer 17 on the collector-side lead frame 12; supplying, onto the Ni plated layer 17, Sn—Ag—Cu-based solder blended with the Cu member 20 and having a Cu content of equal to or greater than 1.5 mass %, and joining the semiconductor element 13; and supplying, onto the semiconductor element 13, Sn—Cu-based solder having a Cu content of equal to or greater than 1.5 mass %, and joining the emitter-side lead frame 11 on which Cu plating is applied onto the Ni plated layer 17. This makes it possible to suppress deterioration of a joint interface with solder and to prevent cracking of a semiconductor element.

(3) A method for manufacturing a semiconductor device, the method includes: forming the Ni plated layer 17 on the collector-side lead frame 12; forming Cu plating on the Ni plated layer 17; supplying Sn—Ag—Cu-based solder having a Cu content of equal to or greater than 1.5 mass % onto the Cu plating, and joining the semiconductor element 13; and supplying, onto the semiconductor element 13, Sn—Cu-based solder having a Cu content of equal to or greater than 1.5 mass %, and joining the emitter-side lead frame 11 on which Cu plating is applied onto the Ni plated layer 17. This makes it possible to suppress deterioration of a joint interface with solder and to prevent cracking of a semiconductor element.

The present invention is not limited to the above-described embodiments, and other forms conceivable within the scope of the technical idea of the present invention are also included within the scope of the present invention as long as the features of the present invention are not impaired. The above-described embodiments may be combined.

REFERENCE SIGNS LIST

1 Sn-based solder
2 conductor (Cu)
3 Ni plating
4 Ni—Sn-based compound
5 Cu—Sn-based compound
6 void
7 semiconductor element crack 8 interface reaction inhibition layer
11 emitter-side lead frame
12 collector-side lead frame
13 semiconductor element
14 emitter-side Sn-based solder
15 collector-side Sn-based solder
16 roughened Ni plated layer
17 Ni plated layer
18 Ni—P plating
19 mold resin
20 Cu member
21 $(Cu, Ni)_6Sn_5$ compound
22 Al electrode
30 emitter-side solder joint
31 collector-side solder joint

The invention claimed is:

1. A semiconductor device, comprising: a semiconductor element; and a first conductor and a second conductor respectively joined to a first surface and a second surface of the semiconductor element via Sn-based solder,
wherein a Ni-based plated layer is formed on surfaces of the first conductor and the second conductor that oppose the Sn-based solder and on the first surface and the second surface of the semiconductor element, and an interface reaction inhibition layer made of $(Cu, Ni)_6Sn_5$ and having a layer thickness of 1.2 to 4.0 μm is formed at an interface between the Ni-based plated layer and the Sn-based solder, and
wherein the first conductor is an emitter-side conductor, the second conductor is a collector-side conductor, and in a solder joint formed of the Sn-based solder and the interface reaction inhibition layer, an emitter-side solder joint is thicker than a collector-side solder joint.

2. The semiconductor device according to claim 1, wherein
the interface reaction inhibition layer has a layer thickness of 1.4 to 3.2 μm.

3. The semiconductor device according to claim 1, wherein
the Sn-based solder is blended with a Cu member.

4. The semiconductor device according to claim 1, wherein
the emitter-side solder joint has a thickness of 120 to 200 μm, and the collector-side solder joint has a thickness of 70 to 100 μm.

5. The semiconductor device according to claim 1, wherein
the emitter-side Sn-based solder has a Cu content of equal to or greater than 2 mass %, and does not contain Ag.

6. The semiconductor device according to claim 1, wherein
the collector-side Sn-based solder has a Cu content of equal to or greater than 2 mass % and contains 2 to 4 mass % of Ag.

7. A method for manufacturing a semiconductor device, the method, comprising:
forming a Ni plated layer on a collector-side lead frame;
supplying, onto the Ni plated layer, Sn—Ag—Cu-based solder blended with a Cu member and having a Cu content of equal to or greater than 1.5 mass %, and joining a semiconductor element; and
supplying, onto the semiconductor element, Sn—Cu-based solder having a Cu content of equal to or greater than 1.5 mass %, and joining an emitter-side lead frame on which Cu plating is applied onto a Ni plated layer.

8. A method for manufacturing a semiconductor device, the method, comprising:
forming a Ni plated layer on a collector-side lead frame;
forming Cu plating on the Ni plated layer;
supplying Sn—Ag—Cu-based solder having a Cu content of equal to or greater than 1.5 mass % onto the Cu plating, and joining a semiconductor element; and
supplying, onto the semiconductor element, Sn—Cu-based solder having a Cu content of equal to or greater than 1.5 mass %, and joining an emitter-side lead frame on which Cu plating is applied onto a Ni plated layer.

* * * * *